United States Patent [19]
Sidman et al.

[11] Patent Number: 5,330,881
[45] Date of Patent: Jul. 19, 1994

[54] MICROLITHOGRAPHIC METHOD FOR PRODUCING THICK, VERTICALLY-WALLED PHOTORESIST PATTERNS

[75] Inventors: Alan L. Sidman, Wellesley; Susan K. Fung, Worcester, both of Mass.

[73] Assignee: Digital Equipment Corp., Maynard, Mass.

[21] Appl. No.: 994,602

[22] Filed: Dec. 21, 1992

Related U.S. Application Data

[63] Continuation of Ser. No. 360,522, Jun. 2, 1989, abandoned.

[51] Int. Cl.$^5$ .................. G03C 1/495; G03C 1/727
[52] U.S. Cl. ................... 430/322; 430/273; 430/325; 430/313; 430/327
[58] Field of Search ............... 430/322, 327, 273, 325, 430/313

[56] References Cited

U.S. PATENT DOCUMENTS

| | | | |
|---|---|---|---|
| 4,315,985 | 2/1982 | Catellani et al. | 430/314 |
| 4,539,616 | 9/1985 | Yuito et al. | 360/125 |
| 4,663,275 | 5/1987 | West et al. | 430/271 |
| 4,869,999 | 9/1989 | Fukuda et al. | 430/311 |

FOREIGN PATENT DOCUMENTS 62-069259  8/1987  Japan .

OTHER PUBLICATIONS

General Electric Microelectronic Materials, User Guidelines, CEM BC5, Apr. 22, 1985.
General Electric Microelectronic Materials, User Guidelines, CEM 388, date unknown.
Chemical and Engineering News, p. 25, May 28, 1984.
Bernard, "Simulation of Focus Effects in Photolithography", IEEE Transactions on Semiconductor Manufacturing, vol. 1, No. 3, Aug. 1988, pp. 85-97.
Etrillard et al., "Metal lift-off using a trilevel resist system for electron beam lithography", Microelectronic Engineering, vol. 7, No. 1, 1987, pp. 11-20.
Lee et al., "Fabrication of Semiconductor CMOS Circuits Using a New Trilayer Photolithographic Process", IEEE Electron Device Letters, EDL-8, No. 9, Sep. 1987, pp. 404-406.
"Fine-Line Pattern Processing for Photoresist Films", NTIS Technical Notes, No. 11, Part c, Nov. 1984, p. 855.
Meyerhofer, "Modelling of Microlithographic Processes: Comparison of Contrast Enhancement Techniques", Journal of Imaging Science, vol. 30, No. 4, Jul./Aug. 1986, pp. 155-159.
Wilkinson, "Weitere Verkleinerung der Halbleiterstrukturen durch Elektronenstrahllithographie", Laser & Optoelektronik, vol. 19, No. 1, Mar. 1987, pp. 55-56.

*Primary Examiner*—Thorl Chea
*Attorney, Agent, or Firm*—Fish & Richardson

[57] ABSTRACT

A microlithographic resist patterning process which allows generation of very thick, vertically-walled resist patterns which allow for subsequent deposition or etching operations can produce high recording density magnetic thin film heads and other devices requiring high aspect ratios.

11 Claims, 2 Drawing Sheets

MICROLITHOGRAPHIC METHOD FOR PRODUCING THICK, VERTICALLY-WALLED PHOTORESIST PATTERNS

This is a continuation of application Ser. No. 07/360,522, filed Jun. 2, 1989, now abandoned.

BACKGROUND OF THE INVENTION

In etching patterns in a masked substrate, some etching processes, such as ion beam milling, may also etch the mask, even when not desired. This is further compounded by the fact that a photoresist mask layer may etch faster than the substrate. One way to assure that the photoresist layer survives long enough to protect the underlying substrate is to make the photoresist thicker. The problem which arises when patterning a narrow line to be etched in the substrate with thick photoresist is that the walls (the profile) of the photoresist are not vertical, as shown in FIG. 1(a). The width of the photoresist near the substrate is greater than the width of the photoresist at the top of the resist. As a result, upon ion beam milling, a portion of the photoresist will be etched away along with the substrate, as shown by dotted line in FIG. 1(b), resulting in the etching of a narrower line width in the substrate than desired as shown by the dotted line in FIG. 1(c).

SUMMARY OF THE INVENTION

One aspect of the invention relates to a method for creating a thick film photoresist mask having vertical walls on a substrate including the steps of coating a substrate with a photoresist compound, preferably to a thickness greater than $3\mu$; coating the photoresist with a solution to form a barrier layer; coating the barrier layer with a layer of contrast enhancing compound; exposing this product to a pattern, wherein the pattern is focused to a position substantially above the substrate surface toward the surface of the contrast enhancing compound layer, stripping the exposed contrast enhancing compound layer and the barrier layer, and developing the exposed photoresist layer. This last step is preferably followed by plasma descumming.

Preferably the pattern is focused about at least 75% above the substrate surface toward the surface of the contrast enhancing compound layer. In one embodiment, the contrast enhancing compound is an aryl nitrone and the barrier layer is an aqueous alkali-soluble optically transparent polymeric layer such as a layer of polyvinyl alcohol.

The process may also involve the steps of etching the substrate and removing the mask. Preferably the etching of the substrate is by ion milling, or sputter or reactive ion etching. Alternatively laser or chemical etching may be utilized. In practice, the method may include depositing material according to the pattern defined by the photoresist by methods such as electroplating, electroless plating and evaporation, among others.

DESCRIPTION OF THE PREFERRED EMBODIMENT

We first briefly describe the drawings.

Figure 1A:
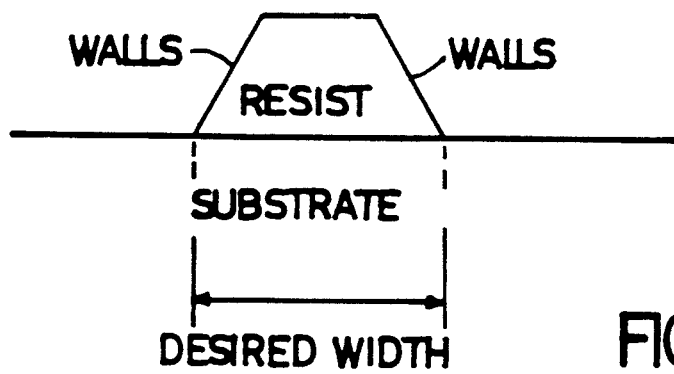
FIG. 1(a) is a cross-section of a thick photoresist mask and substrate known in the prior art.
Figure 1B:
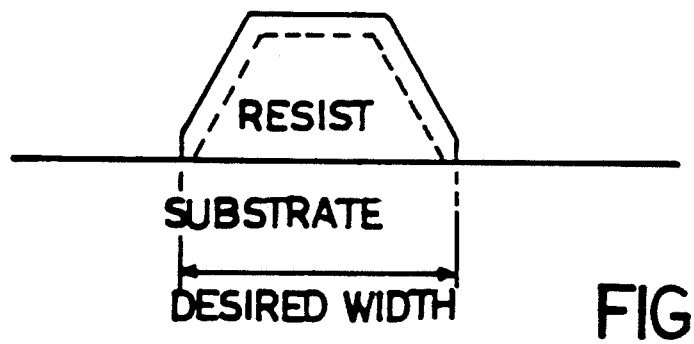
FIG. 1(b) shows the result of ion beam milling upon the photoresist of FIG. 1(a).
Figure 1C:
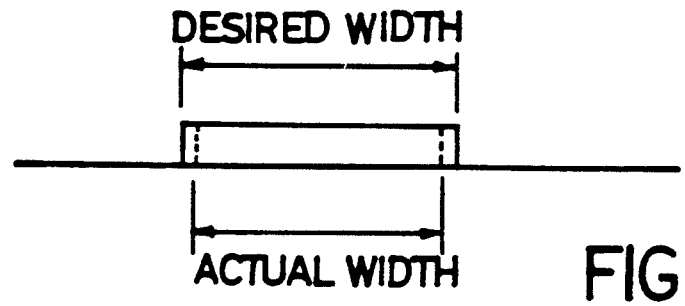
FIG. 1(c) shows the resulting effect on the line width etched in the substrate.
Figure 2:
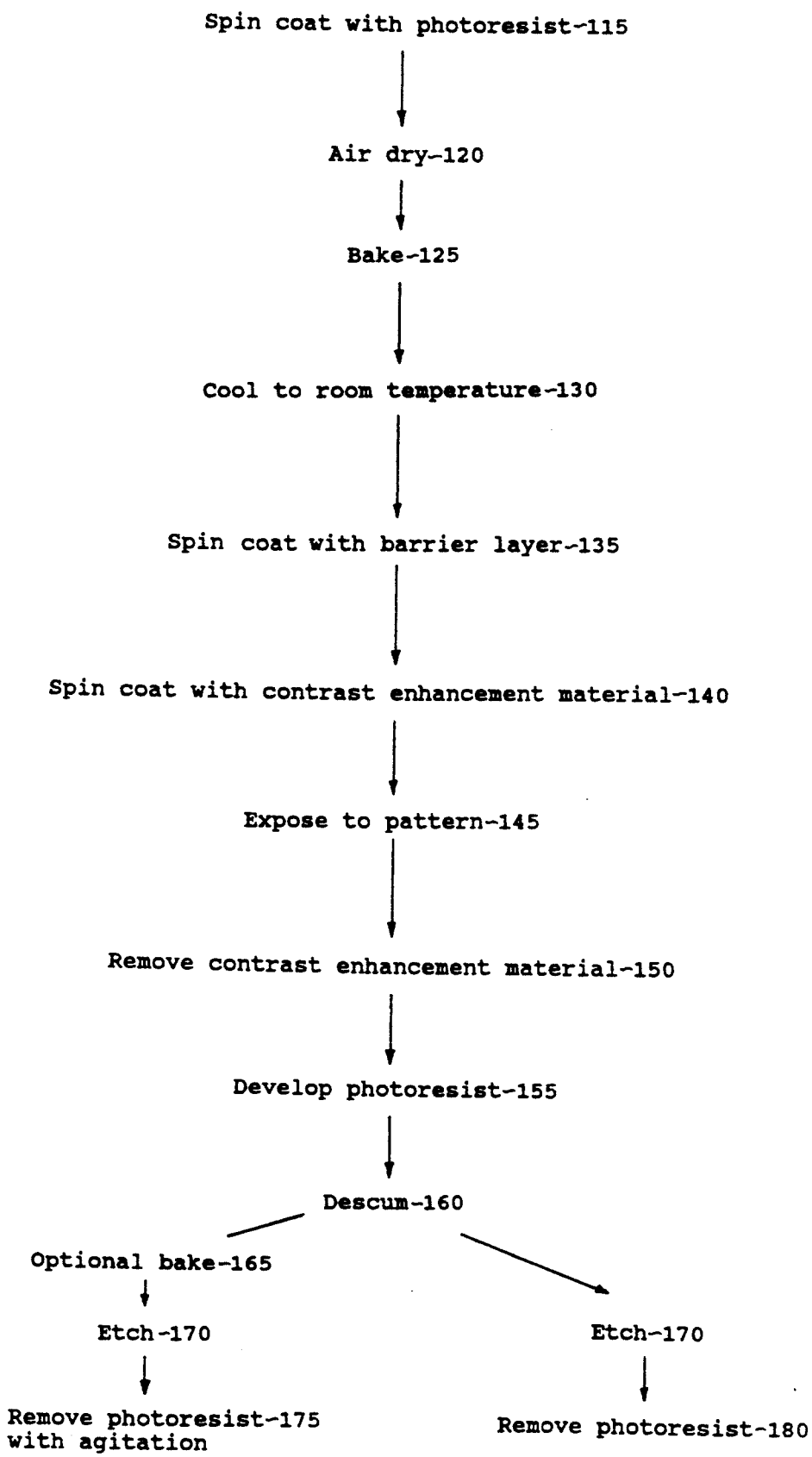
FIG. 2 is a flow diagram of the process of the invention.

Turning now to FIG. 2, a preferred embodiment of a process for economically creating high aspect ratio, vertically walled photoresist masks (and resulting high aspect ratio structures) includes the several steps described below. We define a high aspect ratio (of thickness of the photoresist to width of the mask line or thickness of the resulting structure to its own width) as being 1:1 or greater.

In a first step, the substrate, usually a wafer, is coated 115 with a thick photoresist. In a specific embodiment, AZ-4620 TM manufactured by Hoechst Celanese, was applied to a wafer using a spin coater operating at a speed of 675 RPM for 30 seconds. The photoresist film produced under these conditions was approximately $20\mu$ thick.

The coated wafer is removed and allowed to air dry 120 for 10 minutes under a clean hood. Once the wafer is dried, it is baked 125 in a convection oven at 90° C. for 30 minutes, removed and allowed to cool 130 to room temperature.

The wafer is then coated 135 with a barrier layer such as a 5% solution of polyvinyl alcohol in water. The barrier layer prevents the interfacial mixing of the photoresist and the contrast enhancing layer which is to follow. This barrier layer is allowed to dry for 15 minutes and is not baked. Again, returning to our specific embodiment, applying the polyvinyl alcohol using a spin coater operating at 1000 RPM for 60 seconds, resulted in a barrier layer approximately 1700 angstroms thick.

Next, the wafer is coated 140 with a contrast enhancement compound, such as manufactured by Hüls of America Corporation under the designation CEM-388 or CEM-388WS (water strippable). This compound is a photoactive dye in an inert casting polymer which has been solvated by an organic solvent to facilitate spin coating. The photoactive dye is from the class of organic compounds known as nitrones which have the form:

$$R-CH=N(O)-R$$

where R is either an alkyl or aromatic group. The nitrone is ALPHA-DIMETHYLAMINO PHENYL-N-PHENYLNITRONE, supported in a polystyrene casting polymer. In the CEM-388, the polymer:dye mixture is combined with the solvent, ethyl benzene, at 16% by weight. The resulting solution has a viscosity of about 1.8 centistokes.

Spin coating must be adjusted to obtain sufficient and uniform thickness over high topographies to ensure uniform exposure and develop behavior. In the specific embodiment, the CEM-388 was applied using a spin coater operating at 2000 RPM for 30 sec.

The coated wafer is spun dry and is not baked. The wafer is then mounted into an exposure tool, pattern aligned, and exposed 145 to a masking pattern. The exposure tool is adjusted such that the mask pattern image center of focus is positioned preferably about 75% or greater of the way up from the surface of the substrate layer toward the surface of the contrast enhancement layer. Without this adjustment the image will be defocused and vertical wall resist patterns will not be produced. In the specific embodiment, the wafer is preferably exposed at a wavelength of 401 nm for a total dosage of 6400 mj/cm2.

Following exposure 145, the contrast enhancement layer is removed 150. For CEM-388, an organic solvent, such as a mixture of 85% (by volume) toluene and 15% (by volume) anisole is recommended. This solvent is preferably applied by alternately puddling and spinning the wafer, which is then spun dry for 30 seconds. The CEM-388WS, however, will be stripped using DI water. This step can be incorporated into the develop program on a track system.

The photoeresist is sprayed or immersion developed 155 in positive resist developer. Conditions will vary with resist thickness, type, and exposure dose used. The barrier layer is removed as part of the photoresist development.

The wafer is then plasma descummed 160 to remove organic residues in the exposed/developed open areas. In the specific embodiment, this is done in an oxygen-containing plasma. Optionally, following descumming, the wafer can be post-baked 165 at 130° C. for 30 minutes in a convection oven.

The resulting wafer with high aspect ratio thick film mask can then be etched 170. Substrate etching can take the form of ion milling, sputter etching, reactive ion etching. Alternatively, laser etching or chemical etching may be utilized, for example. Following the substrate etch, the photoresist mask can be removed 180 with acetone or other suitable strippers. However, if the optional baking is performed following descumming, ultrasonic agitation 175 may be required to remove the photoresist mask.

The present invention enables generation of thin film device layers and geometries which could not have been otherwise produced, such as coils, poles and conductors with very high aspect ratios and vertical sidewalls. This is critical to the manufacture of recording heads for high density applications, requiring very narrow thick poles and thick, tightly spaced conductors for high output at high density.

The present invention may also allow generation of vertical walled bond pads, giving rise to improved alumina overcoat composition and mechanical properties, reducing possibility of overcoat defects and pullouts in bond pad lapping. This enhances yield and device reliability in the production of thin film devices. This process may also be used to produce other microelectronic components such as high density interconnects, bubble memories or even semiconductor bond pads, for example.

The present invention requires little additional capital investment, since custom equipment is not required and only commercially available chemical materials are required. Furthermore, this process adds very few extra processing steps to achieve substantial pattern improvement. It provides for greater pattern quality, even on less aggressive device structures. It enhances yields. It provides much enhanced exposure dose latitude while providing thick, high quality vertical patterns. It improves critical dimension control.

Other and further embodiments are within the spirit and scope of the present invention, only to be limited by the claims.

We claim:

1. A method for creating a thick film photoresist mask having vertical walls on a substrate comprising the steps of:
   a. coating a substrate with a thick photoresist compound to form a thick film photoresist layer;
   b. coating the photoresist with a solution to form a barrier layer;
   c. coating the barrier layer with a layer of contrast enhancing compound;
   d. exposing the product of step c to a pattern, wherein a mask pattern image center of focus is positioned only at a single position within the photoresist layer, said single position being about 75% of the way up from the substrate surface toward the surface of the contrast enhancing compound layer, and
   e. stripping the exposed contrast enhancing compound layer and the barrier layer, and developing the exposed photoresist layer.

2. The method of claim 1 wherein the photoresist is about 20 μm thick.

3. The method of claim 1 wherein the contrast enhancing compound is an aryl nitrone.

4. The method of claim 1 wherein the barrier layer is an aqueous alkali-soluble optically transparent polymeric layer.

5. The method of claim 4 wherein the barrier layer is a polyvinyl alcohol.

6. The method of claim 1 wherein the exposure of the product of step c to a pattern is at a wavelength of about 401 nm.

7. The method of claim 1 further including the step (f) of etching the substrate to etch the resultant pattern into the substrate.

8. The method of claim 7 further including the step of removing the mask.

9. The method of claim 1 wherein step e is followed by descumming.

10. The method of claim 7 wherein the etching of the substrate is by ion milling, or sputter, reactive ion, laser, or chemical etching.

11. The method of claim 1 further including the step of depositing material on the product of step e according to the pattern defined by the photoresist.

* * * * *